United States Patent [19]

Akashi

[11] Patent Number: 4,903,239
[45] Date of Patent: Feb. 20, 1990

[54] SEMICONDUCTOR MEMORY HAVING A PARALLEL INPUT/OUTPUT CIRCUIT

[75] Inventor: Yoichi Akashi, Tokyo, Japan
[73] Assignee: NEC Corporation, Tokyo, Japan
[21] Appl. No.: 175,427
[22] Filed: Mar. 30, 1988

[30] Foreign Application Priority Data

Mar. 30, 1987 [JP] Japan .................................. 62-77310

[51] Int. Cl.[4] .............................................. G11C 13/00
[52] U.S. Cl. ............................... 365/189.01; 365/190;
365/207; 365/230.01
[58] Field of Search ............... 365/189, 230, 220, 190,
365/207, 189.01, 230.01, 189.04, 230.05

[56] References Cited

U.S. PATENT DOCUMENTS

| | | | |
|---|---|---|---|
| 4,287,575 | 9/1981 | Eardley et al. | 365/174 |
| 4,580,245 | 4/1986 | Zeigler et al. | 365/190 |
| 4,691,301 | 9/1987 | Anderson | 365/189 |
| 4,725,987 | 2/1988 | Cates | 365/189 |
| 4,737,933 | 4/1988 | Chiang et al. | 365/189 |
| 4,742,847 | 5/1988 | Bernstein | 365/189 |

*Primary Examiner*—Terrell W. Fears
*Attorney, Agent, or Firm*—Sughrue, Mion, Zinn, Macpeak & Seas

[57] ABSTRACT

A memory device having improved read or write function is disclosed. The memory device comprises a memory cell array of a plurality of memory cells, a random selection circuit for reading at least one of the memory cells and a parallel read circuit coupled to a predetermined memory cells without via the random selection circuit for operatively reading the contents of the predetermined number of memory cells.

4 Claims, 3 Drawing Sheets

SEMICONDUCTOR MEMORY HAVING A PARALLEL INPUT/OUTPUT CIRCUIT

BACKGROUND OF THE INVENTION:

The present invention relates to a semiconductor memory, and more particularly to a semiconductor memory suitable for micro-computer system.

Semiconductor memories have been widely utilized in the micro-computer system.

With the conventional memories, the data that can be read or written at one time or one cycle are fixed to a bit width of an input/output (I/O) port of the memories. For example, the bit width of the conventional memories is typically 1 bit or 4 bit, and therefore the data accessed at one time or one cycle is limited to 1 bit or 4 bit. While, the bit width of data bus in the micro-computer system is larger than the bit width of the memories, and is usually 16 bit, or 32 bit.

Accordingly, when the data exceeds the bit width of the I/O port, a latch circuit is provided as an external unit, and the data read from the memory held by the latch are transferred to peripheral device via an additional wiring.

Therefore, with the micro-computer system provided with the conventional memory, data necessitated by the micro-computer are read from the memory through a plurality of read operations or read cycles. However, the read data obtained through the plurality of read operations involve errors when the data are changed during this lengthy reading period, e.g., when a carry has occurred during the period in which the data of a timer circuit are written into the memory. When the data in excess of the bit width of the I/O port of the memory, is to be read-out, the data must be once latched before they are transferred to the micro-computer, or the input to the memory must be inhibited while the data are being transferred in order to prevent the data from changing. Moreover, system which employs the latch circuit to read the data from the memory only but does not work to write the data into the memory.

Furthermore, use of the latch circuit and the additional wiring results in an increase in the required area on the semiconductor substrate, and therefore limitation is imposed when the system including the memory is to be laid out on the same substrate.

SUMMARY OF THE INVENTION:

It is an object of the present invention to provide a memory which enables the data to be accessed in parallel at one time.

It is another object of the present invention to provide a memory suitable for a micro-computer system.

The memory device according to the present invention comprises a memory array of a plurality of memory cells and a random selection circuit for selecting at least one of the memory cells for read or writing, and further comprises a parallel read circuit coupled to a predetermined number of the memory cells without via the random selection circuit for operatively reading contents of the above predetermined number of memory cells in parallel. The above predetermined number is favorably larger than the number of the memory cell or cells selected by the above random selection circuit at one time.

According to the present invention, the contents of the above predetermined number of memory cells can be simultaneously read-out irrespective of the operation of the random selection circuit. Therefore, bit width which can be treated at one cycle can be remarkably increased.

Figure 1:
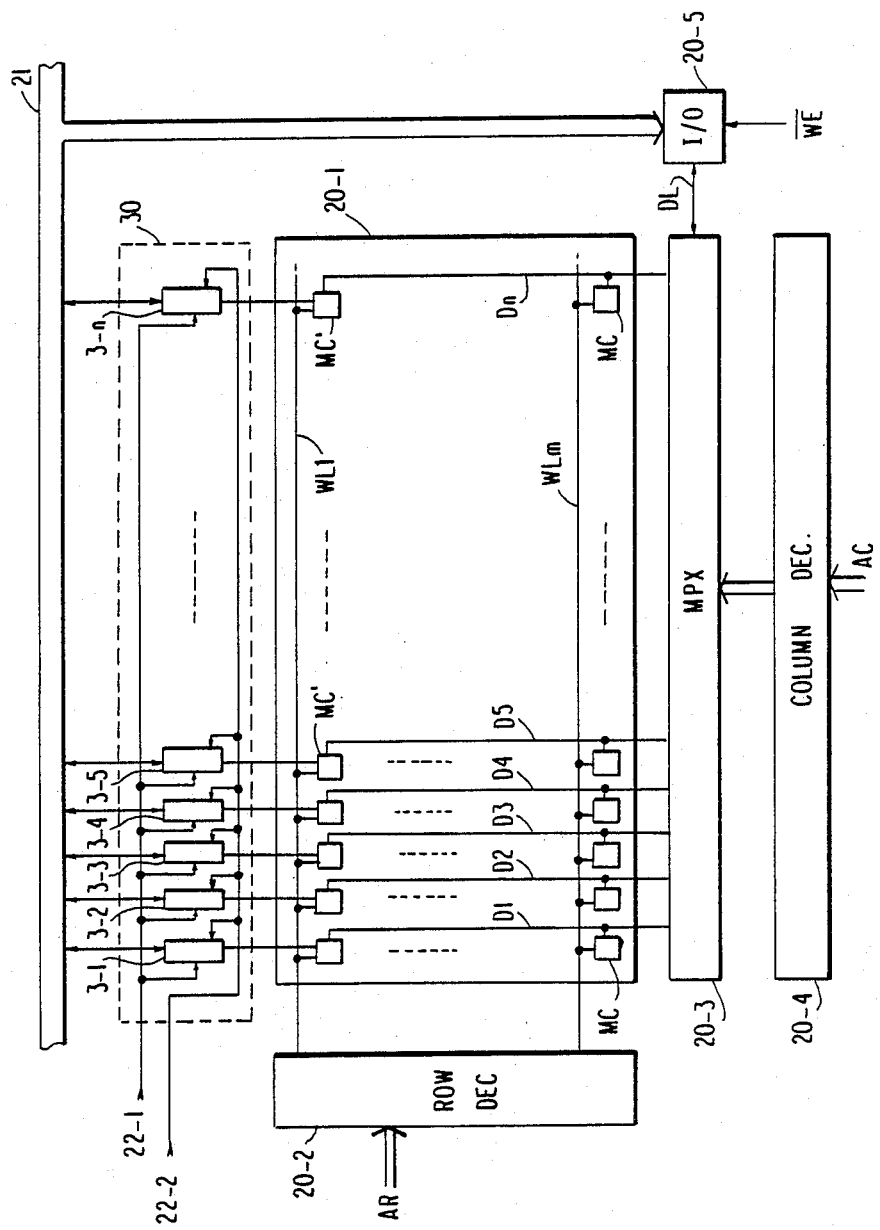
FIG. 1 is a schematic block diagram showing the semiconductor memory according to one embodiment.

DETAILED DESCRIPTION OF THE INVENTION:

Referring to FIG. 1, the semiconductor memory according to one embodiment of the present invention will be explained.

A random memory cell array 20-1 includes a plurality of memory cells MC and MC' coupled to word lines $WL_1$-$WL_m$ in rows and digit lines $D_1$-$D_n$ in columns in a known manner. A row decoder 20-2 receives row address signals AR and selects one of the word lines $WL_1$-$WL_m$. A multiplexer 20-3 selectively establish a signal path between a part of the digit lines and a data bus DL of 4 bit coupled to an input/output circuit 20-5 for outputting or inputting 4 bit data in response to a read-write control signal $\overline{WE}$. A column decoder 20-4 receives column address signals AC to control the multiplexer (MPX) in a known manner. The 4-bit input/output terminals of the I/O circuit 20-5 are coupled to a part of an internal data bus line 21 for data exchange.

A parallel input/output circuit 30 includes a plurality of input/output units 3-1 to 3-n coupled to the memory cells MC' associated with the word line $WL_1$ and the digit lines $D_1$-$D_n$, respectively. The input/output units 3-1 to 3-n are commonly connected to a read control line 22-1 and a write control line 22-2. The number "n" is typically 16.

The memory peripheral circuits 20-2 to 20-5 achieve a know random access operation in the conventional manner.

The input/output units $3_1$ to $3_n$ store the data of one bit only and are, hence, connected to each of the different lines of the data bus 21 so as to be corresponded to the bit number of the data bus 21. For example, if the data bus has 16 bits, the input/output unit 3-1 is connected to a line (21-0) of $2^0$ bit of data bus, the input/output unit 3-2 to a line of $2^1$ bit of the data bus, . . . , and the input/output unit 3-n to a line of $2^{n-1}$ bit of the data bus.

Figure 2:
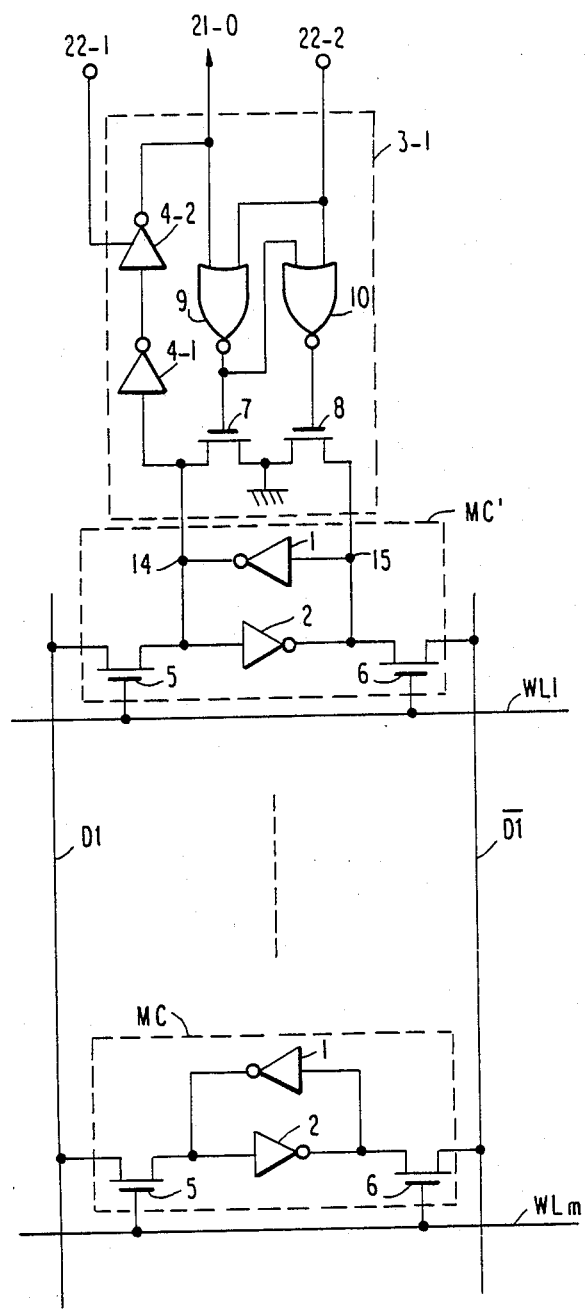
FIG. 2 is a schematic block diagram of the major part of the memory of FIG. 1.

A detailed example of the input/output 3-1 is explained with its relevant memory cell arrangement in FIG. 2.

Each of the memory cells MC, MC' includes inverters 1 and 2 whose inputs and outputs are connected in a crosscoupled manner to form a flip-flop. The pair of input/output nodes 14 and 15 are connected to a pair of digit lines D1 and $\overline{D1}$ via electronic switches 5 and 6 such as transfer gates constituted by insulated gate field-effect transistors. The gates of field-effect transistors that constitute these electronic switches 5 and 6 are connected to a word line. The structure described above is the same as that of the memory cell of a widely known RAM.

The input/output unit 3-1 includes an inverter having an input end connected to the node 14 of the memory cell MC' coupled to WL₁, an output tri-state type inverter 4-2 which is enabled by the read control line 22-1 to produce a read-out signal to one line of the data bus 21. A pair of write transistor 7 and 8 are coupled between a reference potential (GND) and the pair of nodes 14 and 15 of the memory cell MC', NOR gates 9 and 10 serve as a flip-flop to control the transistors 7 and 8 in a complementary manner in response to the level of the one line (21-1) of the bus 21 when the write control line 22-2 is at low in level. The tri-state type operates when the read control line 22-1 is at active, e.g. high in level and makes its output end at a high impedance, floating state when the line 22-1 is at inactive, e.g. low level. Other input/output units 3-2 to 3-n have the same structure as the unit 3-1.

When the word line WL₁ is selected to have the "1" level, the electronic switches 5 and 6 are both turned on, so that the memory cell MC' composed of the inverters 1 and 2 is connected to the digit lines D1 and $\overline{D1}$. Therefore, when the parallel input/output circuit 30 is inoperative, the data can be read from or written onto the memory in an ordinary manner through the I/O circuit 20-5.

When the control line 22-1 assumes the "1" level under the condition where the word line WL₁ is assuming the "0" level, the content of the memory cell MC' is sent to the one line (21-0) of the data bus 21 via inverters 4-1 and 4-2.

On the other hand, when the data are to be written from peripheral equipment onto the memory array 22-1 by utilizing the parallel input/output circuit 30 of the present invention, the write control line 22-2 having the level "0" (GND) is produced. When a data signal has the level "1" on the one line 21-0 of the data bus, the NR gate 9 produces an output "0" and the NR gate 10 produces an output "1", whereby the N-channel transistor 8 is rendered conductive with the transistor 7 non-conductive and "1" is written onto the memory cell MC'. On the other hand, when the signal on the line 21-0 has the level "0", the NR gate 9 produces an output "1" and the NOR gate 10 produces an output "0". Thus, the N-channel transistor 7 is rendered conductive so that "0" is written onto the memory cell MC'. When the write control line 22-2 has the level "1", the two NOR gates 9 and 10 both produce outputs of the "0" level irrespective of whether the signal on the line 22-0 is "0" or "1", and the N-channel transistors 7 and 8 are both turned off. Therefore, it is not allowed to write the data.

To read the data from or to write the data onto the memory cell or cells MC to which the parallel input/output circuit 30 is not connected, the data stored in the memory cells MC are once transferred onto the memory cells MC' to which the parallel input/output circuit 30 is connected. Or the word line WL₁ of the memory cell MC' to which the parallel input/output circuit 30 is connected is maintained at the level "1" during the period when the other word line e.g. WL_m is selected. If the word line WL₁ of the memory cell MC' to which the parallel input/output circuit 30 is connected, is maintained at the level "1" like the aforementioned latter case, the parallel input/output circuit 30 is connected to the digit lines D1 and $\overline{D1}$. Under this condition, if the word line (one of WL₂–WL_m) of the memory cell MC to which no parallel input/output circuit 30 is connected is rendered to assume the "1" level, then the memory cell MC is connected to the parallel input/output circuit 30 via the digit lines D1 and $\overline{D1}$, and it is allowed to read or write the data via the parallel input/output circuit 30.

Figure 3:
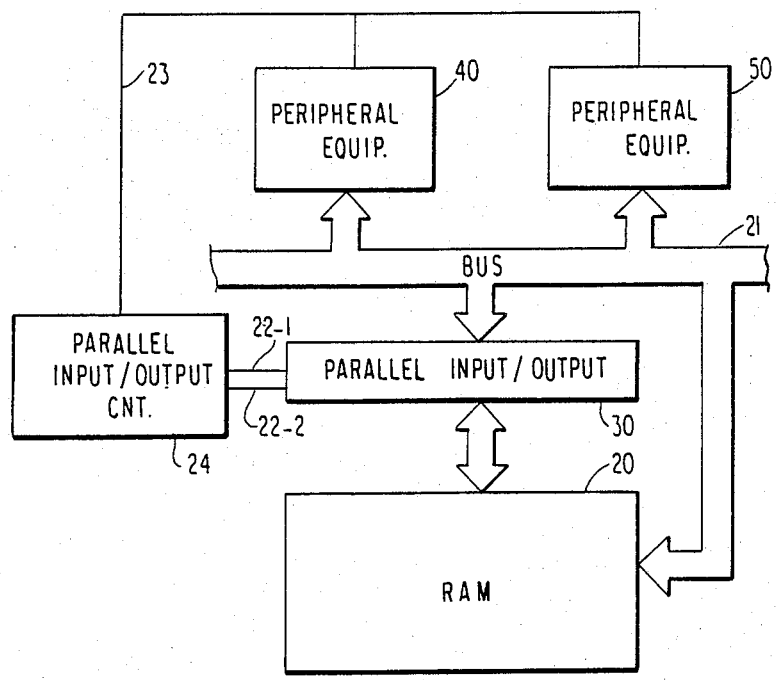
FIG. 3 is a block diagram of a system employing the memory of the present invention.

Referring to FIG. 3, the system employing the memory 20 with the parallel input/output circuit 30 according to the present invention is explained.

The memory 20 (20-1 to 20-5 of FIG. 1) is connected to the bus 21 via the parallel input/output circuit 30. Peripheral equipments 40 and 50 are also connected to the bus 21 for inputting and outputting data in parallel relative to the memory 20. A parallel input/ouput control circuit 24 is connected to the parallel input/output circuit 30 via the control lines 22-1 and 22-2 and is further connected to the peripheral equipments 40 and 50 via a peripheral circuit control line 23.

In the system of FIG. 3, one of the peripheral equipments 40 and 50 is designated and enabled for data transfer with the bus 21 under control of the control line 23. Then, with respect to the selected peripheral equipment, parallel read-out from the circuit 30 or parallel write-in to the circuit 30 is achieved by the control circuit 24 via the control lines 22-1 and 22-2, in the manner explained above.

As has been explained above, according to the present invention it is allowed to transfer in parallel the data of a bit width of the bus between the memory and the peripheral equipment through one instruction.

I claim:

1. A memory circuit comprising a memory array having a plurality of word lines arranged in rows including first and second outermost rows, a plurality of digit lines arranged in columns normal to said rows, and a plurality of memory cells arranged in an array and coupled to said word plurality lines and said digit lines, each of said memory cells being coupled to only one of said word lines and including data storage means having a data node and a transfer gate having a controllable current path connected between said data node and one of said digit line and a control electrode connected to the one of said word lines to which the memory cell is connected, a row decoder coupled to said word lines for operatively selecting one of said word lines in response to row address information thereby to enable the transfer gates of the memory cells coupled to the selected word line, a column selection circuit coupled to said digit lines for operatively selecting a number of said digit lines in response to column address information for data access thereto, a number of signal lines, a parallel read-write unit coupled to said number of signal lines and to a number of memory cells in the first outermost row of said memory array corresponding to the number of signal lines, said parallel read-write unit including read-write circuits of a corresponding to the number of signal lines, each of said read-write circuits having a first node coupled to one of said signal lines and a second node directly connected to the data node of one of said cells in said first outermost row coupled to said parallel read-write unit, each of said read-write circuits transferring a signal at the first node thereof to the second node thereof in a first mode and transferring a signal at said second node to said first node in a second mode, first control means coupled to said read-write circuits for simultaneously setting said read-write circuits in said first mode thereby to simultaneously write signals on said signal lines into the storage means of said memory cells in said first outermost row coupled to said parallel read-write unit, and second control means coupled to said read-write circuits for simultaneously setting said read-write circuits in said second mode thereby to simultaneously read out to said signal lines the states of the storage means of said memory cells in said first outermost row coupled to said parallel read-write unit.

2. The memory circuit according to claim 1, in which the number of signal lines is larger than said number of digit lines selected by said column selection circuit.

3. The memory circuit according to claim 1, in which said column selection circuit is arranged adjacent to said second outermost row.

4. The memory circuit according to claim 1, in which each of said read-write circuits includes a NOR gate having a first input terminal coupled to the first node thereof and a second input terminal coupled to said first control means and an output terminal, a field effect transistor having a current path connected between the second node thereof and a fixed voltage terminal, a buffer having an input terminal connected to said second node and an output terminal connected to said first node and a control terminal coupled to said second control means.

* * * * *